US012771118B2

(12) United States Patent
Gutknecht et al.

(10) Patent No.: US 12,771,118 B2
(45) Date of Patent: Oct. 20, 2026

(54) OVERCURRENT PROTECTION

(71) Applicant: instagrid GmbH, Ludwigsburg (DE)

(72) Inventors: Philipp Gutknecht, Ludwigsburg (DE); Jakob Gantenbein, Ludwigsburg (DE)

(73) Assignee: instagrid GmbH, Ludwigsburg (DE)

( * ) Notice: Subject to any disclaimer, the term of this patent is extended or adjusted under 35 U.S.C. 154(b) by 0 days.

(21) Appl. No.: 19/630,729

(22) Filed: Mar. 27, 2026

(65) Prior Publication Data

US 2026/0229873 A1 Aug. 6, 2026

Related U.S. Application Data

(63) Continuation of application No. PCT/EP2025/054386, filed on Feb. 19, 2025.

(30) Foreign Application Priority Data

Mar. 26, 2024 (EP) .................................... 24166524

(51) Int. Cl.

*H02H 7/00* (2006.01)
*G01R 19/165* (2006.01)
*H02H 1/00* (2006.01)

(52) U.S. Cl.

CPC ......... *H02H 7/008* (2013.01); *G01R 19/1658* (2013.01); *H02H 1/0007* (2013.01)

(58) Field of Classification Search

CPC ... H02H 7/008; H02H 1/0007; G01R 19/1658
See application file for complete search history.

(56) References Cited

U.S. PATENT DOCUMENTS 5,793,623 A * 8/1998 Kawashima ............ H02P 27/08 363/56.05
7,737,645 B2 6/2010 Meid
11,175,349 B2 * 11/2021 Bhalwankar ............. H02H 7/12
11,538,628 B2 * 12/2022 Aljadeff ............. G01R 19/0007
12,212,130 B2 * 1/2025 Wambsganss ..... G01R 31/1227
2002/0149891 A1 10/2002 Neiger et al.
2011/0211378 A1 * 9/2011 Maroon ................ H02M 7/003 363/125
2013/0128396 A1 5/2013 Danesh et al.

* cited by examiner

*Primary Examiner* — Rafael O De Leon Domenech
(74) *Attorney, Agent, or Firm* — The Webb Law Firm

(57) ABSTRACT

A protection circuit for protecting an electrical power system, including a current sensor configured to generate an electric signal wherein the current sensor has a measurement dynamic range; a rectifying module configured to generate a pulsating DC signal; a superimposing module configured to generate an expanded signal; a low-pass filter configured to shape the expanded signal to generate a band-limited signal; a logic module configured to generate a trip signal when the band-limited signal violates a predetermined threshold; wherein the trip signal is usable for cutting off the flow of the AC current. The present teachings also relate to related methods and software products.

20 Claims, 5 Drawing Sheets

OVERCURRENT PROTECTION

CROSS-REFERENCE TO RELATED APPLICATIONS

This application is a Bypass Continuation Application of International Patent Application No. PCT/EP2025/054386 filed Feb. 19, 2025, and claims priority to European Patent Application No. 24166524.9 filed Mar. 26, 2024, the disclosures of which are hereby incorporated by reference in their entireties.

BACKGROUND

Field

The present teachings relate to protection circuits for protecting an electrical power system. The present teachings further relate to methods and software products.

Description of Related Art

Electrical power systems for providing off-grid electrical energy to different loads are known from state of the art. These electrical power systems can be used as electrical socket for electrical consumers, such as power tools on construction sites, for lighting devices, for emergency appliances (e.g., pumps) or any kind of mobile device and in cases where no permanent energy supply is available. In particular, it may be desirable that these power systems are portable.

In order to conveniently power a large variety of electrical consumers, such an electrical power system may be designed to provide an AC power at the electrical output, and it may even be chargeable via an electrical input, e.g., with AC power.

Generally, electrical power systems are provided with a protection device (e.g., circuit breaker or fuse), which interrupts the power circuit in case of harmful overcurrent to prevent the electrical power system from being damaged. However, in some electrical power systems it may be desirable to have a large peak load capacity, which allows temporary large peak currents, such as those which rotating tools or electrical motors may need during startup. Thus, for a proper operation the protection circuit would need to operate in these two modes so as to prevent undesired interruption during peak loads, as well as protecting the system during overcurrent.

Some of the above problems associated with the existing art will be shown solved with the subject matter of the herein appended independent claims. Dependent claims, and the specification will show certain additional advantageous aspects.

Protection devices such as standard miniature circuit breakers combine a tripping mechanism and a disconnection point in one component and are looped into the line to be protected. When the circuit breaker is tripped (e.g., due to overcurrent), the disconnection point is opened and the line is de-energized to prevent harm (e.g., to the circuit components related to the line). In some cases, two tripping mechanisms may be superimposed: e.g., a thermal tripping mechanism, which reacts slowly and is sensitive to a more sustained increase in the line current beyond the rated current value. Additionally, a faster tripping mechanism may be provided (e.g., a magnetic tripping mechanism), which is sensitive to high line current values within short times. The current-time characteristics of such a device can be very complex. In some cases, current-time characteristics of an electrical power system may not align with those of such a protection device, thus causing false trips of the electrical circuit.

Moreover, in some applications it may be further desirable for an electrical power system to be able to provide multiple types of output voltages. For example, an electrical power system which can operate at (input and/or output) 240 V AC mains as well as 120 V AC mains (e.g., in same or separate configurable modes) may allow the same system to handle electrical consumers and/or inputs rated for any of these voltage domains. It shall be recognized that 240 V 50 Hz AC domain is predominantly used in Europe, while 120 V 60 Hz AC domain is predominantly used in the United States. It shall be appreciated that the exact voltage value and/or frequency of the voltage domain is not essential to the generality or scope of the present teachings. There may even be more than two domains of any standard or non-standard type in terms of voltage and/or frequency. E.g., while a mains frequency of 50 Hz is used in Europe, while it is usually 60 Hz in the US, the present teachings can even allow 120 V AC at 50 Hz, or 240 V AC at 60 Hz. Thus, the present teachings can apply to essentially any voltage domain and any frequency.

SUMMARY

It is therefore the underlying object of the present teachings to provide a protection circuit for protecting an electrical power system and method and software product to provide overcurrent protection. The protection circuit and method and software product can be adapted to different output parameters, e.g., different AC output voltages.

A protection circuit for protecting an electrical power system pursuant to the present teachings comprises a current sensor configured to generate an electric signal by measuring an AC current flowing via the electrical power system, wherein the current sensor has a measurement dynamic range (e.g., $\pm V_{dyn}$). The current sensor facilitates measurement of electrical AC current flowing through the electrical power system, e.g., in order to monitor the output current of the electrical power system. The current sensor can be implemented e.g., into one line at the output (e.g., in an output line) of the electrical power system. The current sensor can be any current sensor, e.g., the signal generated by the current sensor may be a voltage signal representing the measured current.

The current sensor has a given measurement dynamic range (e.g., $\pm V_{dyn}$), which e.g., may be defined as the range in which the output signal of the current sensor is readable. For example, the dynamic range may be the range within which the output signal has a defined relationship (e.g., gain) with the AC current. As another example, the dynamic range may be the range within which the output signal is proportional to the AC current. In practical sensors, dynamic range limits are defined, e.g., by the power supply voltage of the sensor circuit by which the sensor or the sensor circuit is powered. Generally, for a given application the dynamic range and sensitivity (e.g., resolution) of a current sensor may be selected such that the rated level of operating current can be observable within the limits of the dynamic range. In other words, for the current sensor the range of variation of the nominal operating AC current should be readable within the limits of the dynamic range. For an electrical power system which should also handle large peak currents, this can lead to either of the two situations: first, selecting a current sensor which can measure up to the highest peak current within the limits of the dynamic range; or second, selecting a current sensor which can measure just the rated level of operating current within the limits of the dynamic range. In the first case, the problem can be that for nominal operating range, the dynamic range of the sensor is not efficiently used. This can also reduce resolution (e.g., ability to detect small changes) for the nominal operating current. The problem is further aggravated the larger the peak currents are as compared to the operating currents. In the second case, the problem can be that the current sensor output will not provide visibility for peak currents (e.g., due to saturation of the sensor, or clipping of the sensor output). The present teachings can overcome these limitations, including those for multiple types of output voltages for which load current values can change when a different output voltage is selected, even if the output power supplied is the same.

Thus, for larger electric currents, e.g., occurring in a boost mode of the electrical power system, in cases where a powered load such as a rotating tool is started, the peak electric current flowing via the electric system is outside of the measurement dynamic range of the current sensor, if the sensor has a dynamic range defined by the limits of the nominal operating current.

Pursuant to certain embodiments, the protection circuit further comprises a rectifying module configured to generate a pulsating DC signal in response to the electric signal. The electric signal from the current sensor, which is in particular an AC signal, is rectified by means of the rectifying module for subsequent signal processing.

The protection circuit further comprises a superimposing module operable to generate an expanded signal; wherein the expanded signal is equal to or tracking the pulsating DC signal for the duration the pulsating DC signal is below a predetermined value (e.g., $V_p$), and wherein the expanded signal has a preselected value (e.g., $V_s$) for the duration the pulsating DC signal is at or above the predetermined value (e.g., $V_p$). For example, the predetermined value (e.g., $V_p$) is at or below the boundary of the measurement dynamic range (e.g., $V_{dyn}$). In some non-limiting aspects, magnitude of the preselected value (e.g., $|V_s|$) is higher than magnitude of the predetermined value (e.g., $|V_p|$). For example, e.g., in cases when the values are positive, the preselected value (e.g., $V_s$) may be higher than the predetermined value (e.g., $V_p$).

A purpose of the superimposing module is to generate a signal for further signal processing when the output signal of the current sensor is at or exceeds limit of the current sensor dynamic range. The superimposing module thus allows creation of a signal (e.g., expanded signal) which contains information of the duration for which the current sensor output is outside certain limits (e.g., dynamic range). This can be helpful at times in which the AC current flowing via the electrical power system is above the measurement dynamic range of the current sensor and the electric signal cannot be relied on. When the AC current is outside the dynamic range, further components downstream of the current sensor may be "blind" to the actual values of AC current. Thus, in case of such high amplitudes of the electric signal at or above the predetermined value (e.g., $V_p$), the pulsating DC signal is replaced by the preselected value (e.g., $V_s$). The preselected value (e.g., $V_s$) may be a value corresponding to an out of measurement dynamic range value of the current sensor. In case of lower amplitudes of the pulsating signal, the expanded signal is kept equal to the pulsating signal. Consequently, if the pulsating DC signal has amplitudes below the predetermined value, the pulsating DC signal remains unchanged by the superimposing module.

The protection circuit further may further comprise a low-pass filter configured to shape the expanded signal to generate a band-limited signal. The low-pass filter may have a time constant (e.g., $\tau$).

Further, the protection circuit may comprise a logic module operable to generate a trip signal when the band-limited signal violates a predetermined threshold (e.g., $V_{th}$). The trip signal is usable for cutting off the flow of the AC current, thereby bringing the electrical power system in a safe state.

The logic module may comprise at least one comparator e.g., with an assigned threshold voltage (e.g., $V_{th}$). If the band limited signal exceeds the threshold voltage, the generated trip signal will cut off the current flowing through the electrical power system and the electrical power system is set in a safe state.

The protection circuit described above thus works as an adjustable circuit breaker. Depending on the respective output voltage and therewith associated output current, the current-time characteristics of the protection circuit can be adjusted, thereby supporting the scenario where high peak currents are necessary for turn on of loads connected to the output of the electrical power system. The safety and reliability of the electrical power system is assured by preventing damage due to excessive current. The protection circuit further replaces the function of a disconnection point of a conventional circuit breaker with a possibility to actively switch off the electrical power system.

The respective set up, described above can allow for multiple adjustments to shape the characteristics of the protection circuit in terms of current flow over time with respect to the AC output voltage selected at the output of the electrical power system.

For example, the following settings can be made in order to reflect the different AC output voltages:

- The predetermined value (e.g., $V_p$) of the superimposing module,
- the preselected value (e.g., $V_s$) of the superimposing module,
- the setting of the low-pass filter, in particular the time constant (e.g., $\tau$),
- the predetermined threshold (e.g., $V_{th}$) of the logic module.

Depending on the values chosen, the current-time characteristics of the protection circuit may be tuned. The setting of the predetermined value (e.g., $V_p$) of the superimposing module can shape the steepness of the current-time characteristics for small time values and large currents. The setting of the combination of the time constant of the low-pass filter and the predetermined threshold $V_{th}$ of the logic module shape the curve mainly for moderate to larger time values and smaller currents.

In a non-limiting embodiment, the protection circuit comprises at least two low-pass filters in cascade. The first low pass filter is in particular a single pole (e.g., first order) low-pass filter, followed by at least one second low-pass filter (e.g., single pole low-pass filter). For example, the first low pass filter may have a smaller time constant (e.g., $\tau_1$) than the time constant (e.g., $\tau_2$) of the second low pass filter. In this cascade arrangement, the at least one further low-pass filter further processes the signal in the cascade path (e.g., the band-limited signal).

In some cases, the protection circuit may comprise multiple (e.g., a plurality of) low pass filters. Preferably, at least some of the plurality of low pass filters are connected in parallel. For example, the first low pass filter may be connected in series with each of the further low pass filters. Arrangements with such multiple low pass filters can allow for a more precise adjustment of characteristics of the protection circuit.

Each low pass filter may be characterized by a time constant (e.g., $\tau_1$). In some embodiments, the time constants of the multiple low-pass filters are chosen in such a way, that the time constant (e.g., $\tau_{i+1}$) of a further low pass filter is larger than the time constant (e.g., $\tau_1$) of the previous low pass filter. For example, in a cascaded case, the first low pass filter may have the smallest time constant (e.g., $\tau_1$) and the further low-pass filters may have time constants larger than the time constant of the first low-pass filter (e.g., $>\tau_1$).

In a further non-limiting embodiment, the logic module operable to generate the trip signal when the band-limited signal violates a predetermined threshold (e.g., $V_{th}$) comprises at least one comparator. The comparator may be operable to compare the band-limited signal with the predetermined threshold (e.g., $V_{th}$). The trip signal is generated in response to the band-limited signal violating the threshold (e.g., $V_{th}$).

For example, the logic module may comprise at least two comparators, wherein the predetermined threshold of a further comparator (e.g., $V_{th,i+1}$) may be different (e.g., lower) than the threshold voltage (e.g., $V_{th,i}$) of the previous comparator.

In some non-limiting embodiments, at least two of the comparator outputs are processed via a logical OR operation. For example, for cases when any one or more comparators detect a violation of their respective predetermined threshold (e.g., $V_{th}$) the trip signal is generated. The trip signal causes the electrical power system to go to a safe state, e.g., by interrupting flow of electrical current via the electrical power system.

In some non-limiting embodiments, the multiple low-pass filters and the multiple comparators are connected in such a way, that each low-pass filter is connected to a corresponding comparator (e.g., each low-pass filter provides its output at input of its corresponding comparator). The protection circuit may have the same number of low-pass filters as there are comparators. For example, the low-pass filters and their corresponding comparators are paired such that low-pass filters with smaller time constants (e.g., $\tau$) are connected to comparators with lager predetermined thresholds (e.g., $V_{th}$). It shall be appreciated that this and similar arrangements can be used to generate characteristics of a desired circuit breaker over an operating range. This may be used for generating a trip signal which reflects amplitude and time duration aspects of the current flow, thereby allowing setting limits or tolerances for a particular amplitude value of the current and duration for which it can be tolerated without triggering the trip signal.

It shall be appreciated that several or all of the comparators may be connected in a logical OR configuration with one or more OR gates to achieve a trip profile reflecting current and time relationship for the electrical current. For example, two-input OR gates (realized in hardware or software) may be arranged such that a first input is received from a comparator, and a second input is received via an output of the preceding OR gate. Thus, at least some of the OR gates may be connected in such a serial OR fashion. With a single OR gate, the logic may need to have the same number of inputs as there are comparators. However, any particular kind of OR logic realization is not limiting to the generality or scope of the present teachings.

Alternatively, or in combination, the protection circuit may comprise a limit detector, which is operable to detect when the pulsating DC signal is at or above a predetermined value. The limit detector may compare the pulsating DC signal to the predetermined value and allow the superimposing module to process the pulsating DC signal (e.g., in cases when the pulsating DC signal is at or above the predetermined threshold (e.g., $V_p$) with the preselected value (e.g., $V_s$)).

In some embodiments, the predetermined value (e.g., $V_p$) may be at or lower (e.g., just lower) than the limit of the measurement dynamic range. This can be done e.g., to ensure that high electric currents flowing via the energy supply unit are handled as desired via the protection circuit.

As discussed, the preselected value (e.g., $V_s$), which replaces the pulsating DC signal in cases the amplitude of the pulsating DC signal exceeds the predetermined value (e.g., $V_p$), is larger than the limit (e.g., boundary) of the measurement dynamic range. For example, the preselected value may be at least twice as high, or at least times as high as the boundary (e.g., upper limit) of measurement dynamic range. The preselected value may be higher than the maximum measurement output of the current sensor. It shall be appreciated, however, that there may or may not be a correlation between the limit of the measurement dynamic range and the preselected value. Accordingly, the preselected value may be an arbitrarily large value outside the dynamic range. It is also possible that the preselected value is chosen according to one or more parameters (e.g., time constant of the low-pass filter to which the expanded signal is fed) such that a particular current-time characteristic of the protection circuit is obtained (e.g., "hockey-stick" part of the time response of the protection circuit).

It shall be appreciated that some or all the modules or components discussed herein may, without limitations, be implementable in hardware and/or software. For example, the rectifying module, the superimposing module, the low-pass filter and/or the logic module may any one, some, or all be implemented at least partially in a digital form (e.g., as algorithm or software, such as embedded code or similar). Additionally, or alternatively, the limit detector module may be implemented at least partially in digital form. The implementation of the modules in terms of software can allow flexibility (e.g., run-time adjustment of the characteristics) of the respective components and/or of the current-time characteristics of the protection circuit during operation of the electrical power systems. The respective settings can be adapted and/or selected depending on the mode of operation, e.g., selected voltage domain (e.g., 220 V AC, 120 V AC, or any other) at which the electrical power system should operate in.

Additionally, or alternatively, any parts, e.g., the rectifying module, the superimposing module, the low-pass filter, the logic module and/or the limit detector module may be implemented at least partially in a hardware form (e.g., as a circuit).

The present teachings are particularly advantageous for an electrical power system with multiple electrical energy storage cells, an AC output and an AC input and a protection circuit as described above, wherein the voltage at the AC output is variable (e.g., operable in multiple AC domains e.g., 220 V AC, 110 V AC, etc.).

The present teachings can further provide a method for overcurrent protection for an electrical power system with an AC output, in particular using the protection circuit as disclosed herein, the method comprising:

- Measuring an AC current flowing via the electrical power system with a current sensor and generating an electric signal in response, wherein the current sensor has a measurement dynamic range;
- Rectifying the electric signal to provide a pulsating DC signal (e.g., in response to processing the electric signal with a rectifying module);
- Generating an expanded signal with a superimposing module; wherein the expanded signal is equal to or tracking the pulsating DC signal for the duration the pulsating DC signal is below a predetermined value, and wherein the expanded signal has a preselected value for the duration the pulsating DC signal is at or beyond (e.g., above) the predetermined value;
- Generating a band-limited signal by shaping the expanded signal with a low-pass filter;
- Generating a trip signal when the band-limited signal violates a predetermined threshold (e.g., by evaluating with a logic module); wherein the trip signal is usable for cutting off the flow of the AC current, thereby bringing the electrical power system in a safe state.

For advantages and features in connection with the method it is referred to the description of the system aspects.

The present teachings further relate to a software product comprising instructions which when executed by a suitable computer processor cause the processors to perform the method steps as discussed above.

BRIEF DESCRIPTION OF THE DRAWINGS

The terms Fig., Figs., Figure, and Figures are used interchangeably in the specification to refer to the corresponding figures in the drawings.

Further embodiments are shown with reference to the following figures, showing certain aspects of the present teachings by way of examples.

Figure 1:
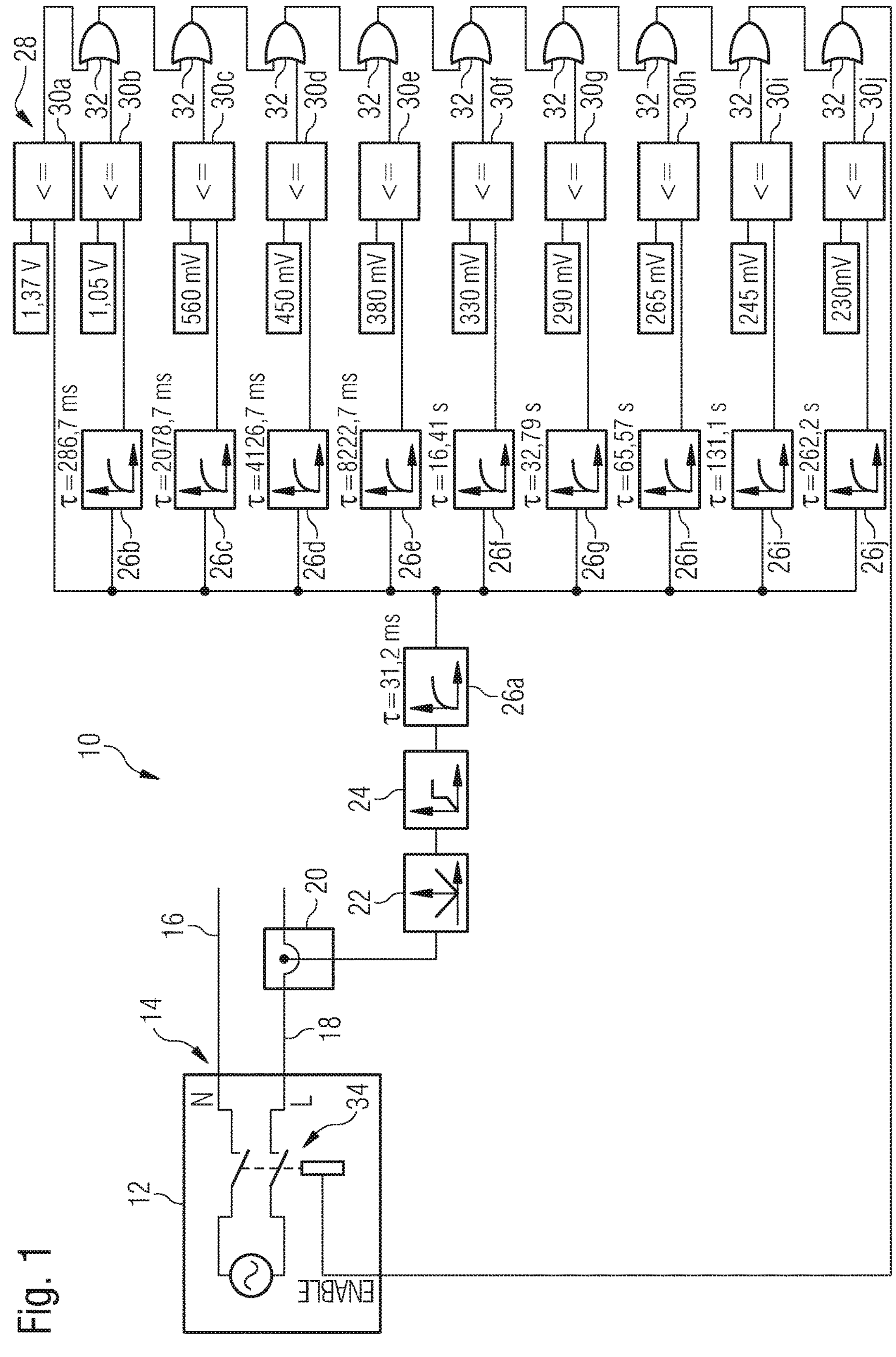
Figure 2:
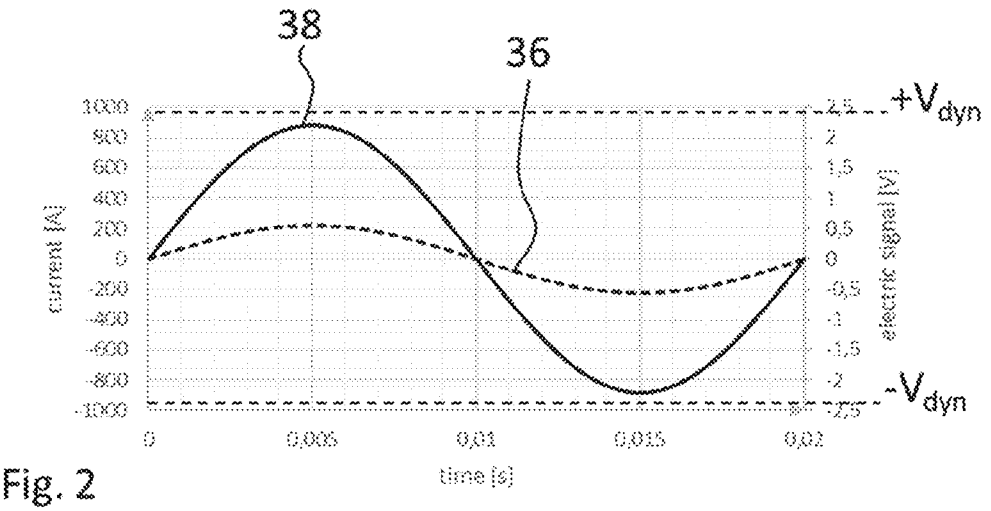
Figure 3:
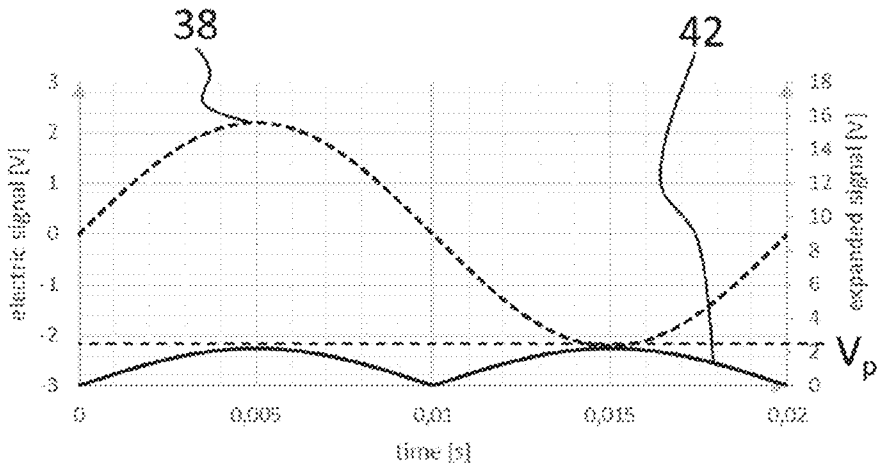
Figure 4:
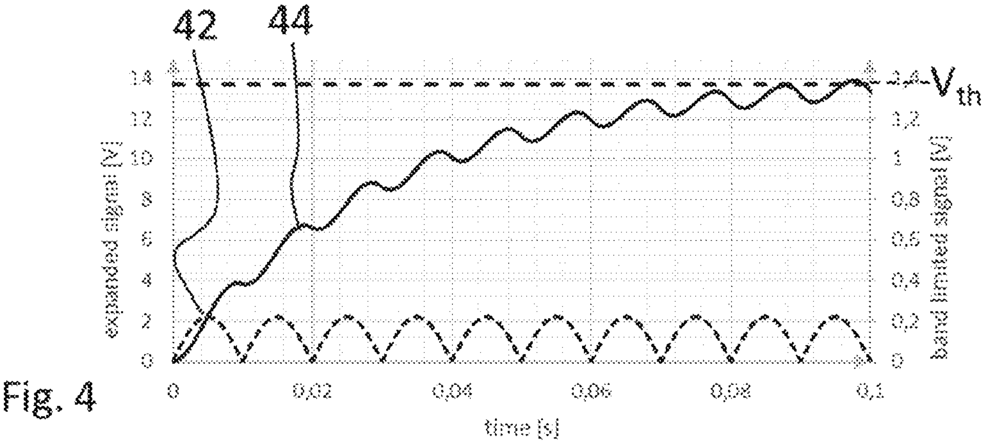
Figure 5:
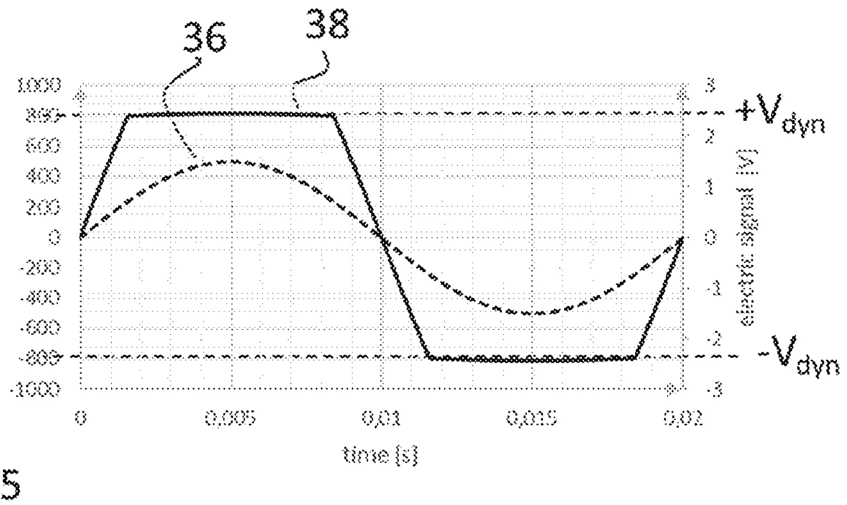
Figure 6:
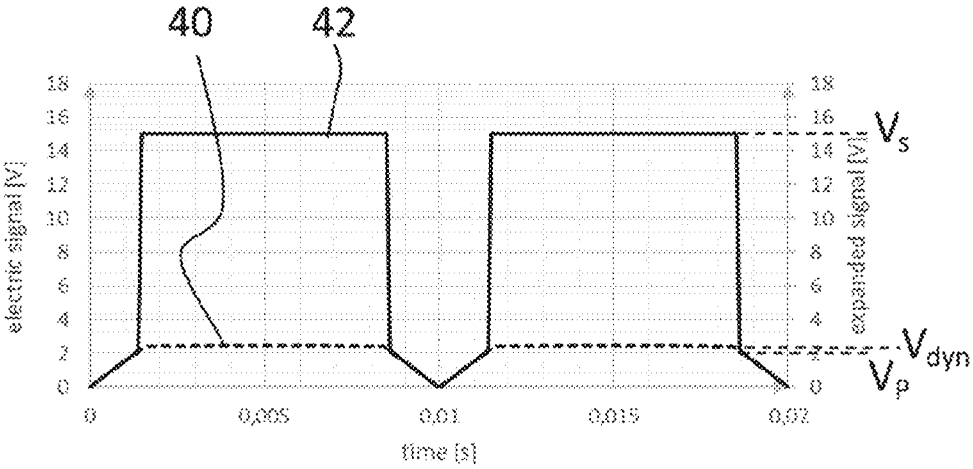
Figure 7:
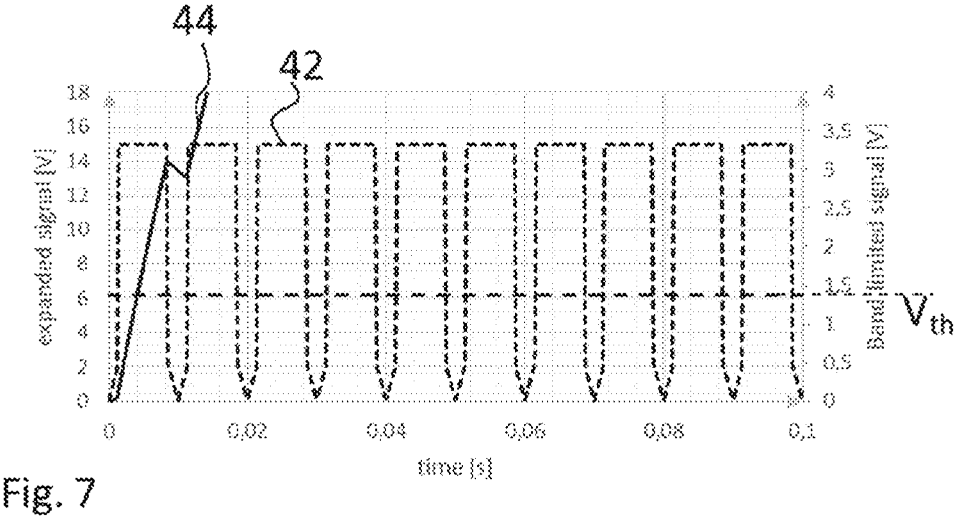
Figure 8:
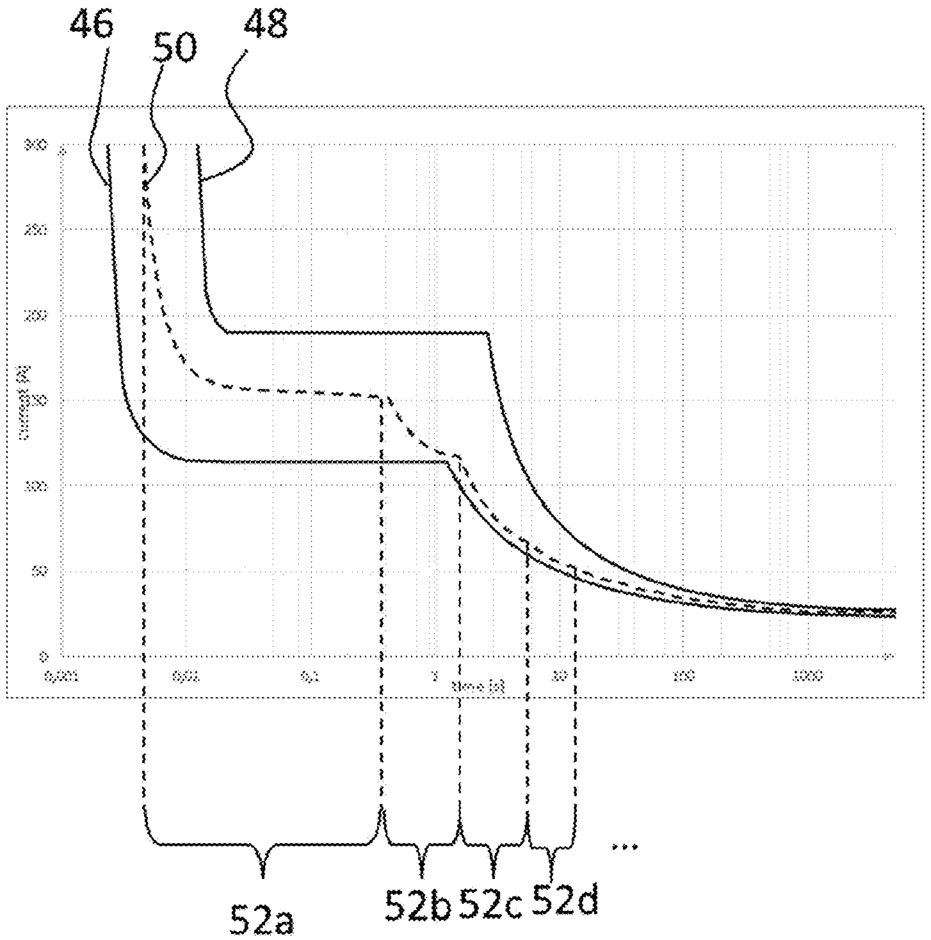
Figure 9:
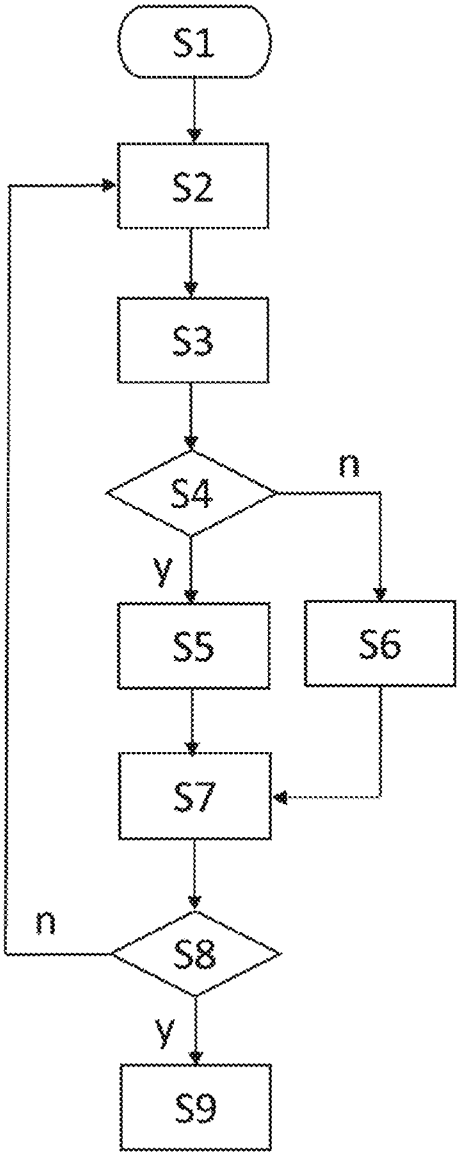

Shown on:

FIG. 1 is a block diagram of a protection circuit,

FIG. 2 is a diagram of an AC current and an electric signal over time in a first operation mode of the electrical power system, FIG. 3 is a diagram of the electric signal and an expanded signal over time according to the first operation mode of the electrical power system, FIG. 4 is a diagram of the expanded signal according to FIG. 3, a band-limited signal, and a threshold voltage of the logic module over time according to the first operation mode of the electrical power system, FIG. 5 is a diagram of an AC current and an electric signal over time in a second operation mode of the electrical power system, FIG. 6 is a diagram of a pulsating DC signal and an expanded signal over time according to the second operation mode of the electrical power system, FIG. 7 is a diagram of the expanded signal according to FIG. 6, a band-limited signal, and a threshold voltage of the logic module over time according to the second operation mode of the electrical power system, FIG. 8 is a diagram of standard circuit breaker characteristics and resulting circuit breaker characteristics in voltage over time, FIG. 9 is a flowchart of a method for overcurrent protection.

DETAILED DESCRIPTION

FIG. 1 depicts a block diagram of a protection circuit 10 for an electrical power system 12.

FIGS. 2 to 7 are diagrams showing different signal obtained at the output of the different components of the protection circuit 10.

The electrical power system 12 is capable of supplying loads e.g., with temporary off-grid electrical energy. To connect the electrical power system 12 to a tool, the electrical power system 12 comprises a two-pole output 14. It shall be appreciated that in some power domains without having any restriction on the scope of generality of the present teachings, N (16) and L (18) may be called L1 and L2, or by any other name.

To measure the AC current flow via the electrical power system 12, the protection circuit 10 comprises a current sensor 20, arranged in line with any of the conductors 16 or 18, (in this example, the so-called phase conductor 18).

The current sensor 20 is arranged to generate an electric signal 38 (see e.g., FIG. 2) by measuring the AC current 36 (see e.g., FIG. 2) flowing via the electrical power system 12, wherein the current sensor 20 has a measurement dynamic range (e.g., $\pm V_{dyn}$). The measurement dynamic range (e.g., $\pm V_{dyn}$) lies in the shown example at ±240 A, and ±2.4 V, respectively (see e.g., FIG. 2). In other words, using this non-limiting example, the current sensor 20 provides the electric signal 38 which lies between ±2.4 V for a current 36 having a variation of ±240 A. Hence, values of ±240 A of the current 36 are readable via the current sensor 20, the electric signal 38 correspondingly varying by ±2.4 V.

Connected at the output of the current sensor 20 is a rectifying module 22 operable to generate a pulsating DC signal 40 (see FIG. 6) in response to the electric signal 38.

The rectifying module 22 is connected to a superimposing module 24 operable to generate an expanded signal 42 (see e.g., FIG. 3). The expanded signal 42 is equal to or tracking the pulsating DC signal 40 for the duration the pulsating DC signal 40 is below a predetermined value $V_p$, and wherein the expanded signal 42 has a preselected value $V_s$ for the duration the pulsating DC signal 40 is at or above the predetermined value $V_p$. The predetermined value $V_p$ is chosen in this example as 2.2 V, below the measurement dynamic range of the current sensor 20. The preselected value $V_s$ is set in this example to 15 V.

The expanded signal 42 is used as input to a first low-pass filter 26*a* operable to shape the expanded signal 42 to generate a band-limited signal 44.

In cascade to the first low-pass filter 26*a*, optionally, multiple low-pass filters 26*b*-26*j* are arranged in parallel. Here nine low-pass filters 26*b*-26*j* are connected in parallel and in cascade to the first low-pass filter 26*a*.

The low-pass filters 26*a* to 26*j* are linked to a logic module 28 operable to generate a trip signal when the band-limited signal 44 violates a predetermined threshold $V_{th}$. The logic module 28 comprises multiples comparators 30*a*-30*j*, each comparator 30*a*-30*j* linked to one low-pass filter 26*a*-26*j*.

The comparators 30*a*-30*j* are linked via logical OR operators 32, which shows one of the ways that an OR function can be implemented by two-input OR gates.

In the shown example the following values have been used for the low-pass filters 26*a*-26*j* and corresponding comparators 30*a*-30*j*:

| Time constants τ of low-pass filters | Corresponding predetermined threshold $V_{th}$ of comparators |
|---|---|
| τ1 = 31.2 ms | $V_{th,1}$ = 1.37 V |
| τ2 = 286.72 ms | $V_{th,1}$ = 1.05 V |

-continued

| Time constants τ of low-pass filters | Corresponding predetermined threshold $V_{th}$ of comparators |
|---|---|
| τ3 = 2078.7 ms | $V_{th,1}$ = 560 mV |
| τ4 = 4126.7 ms | $V_{th,1}$ = 450 mV |
| τ5 = 8222.7 ms | $V_{th,1}$ = 380 mV |
| τ6 = 16.41 s | $V_{th,1}$ = 330 mV |
| τ7 = 32.79 s | $V_{th,1}$ = 290 mV |
| τ8 = 65.57 s | $V_{th,1}$ = 265 mV |
| τ9 = 131.1 s | $V_{th,1}$ = 245 mV |
| τ10 = 262.2 s | $V_{th,1}$ = 230 mV |

The generated trip signal is usable for cutting off the flow of the AC current 36. The logical unit is connected to a switch 34, to cut-off the AC current flowing via the electrical power system 12, thereby bringing the electrical power system 12 in a safe state.

By means of FIGS. 2 to 7 the basic functionality of the different modules of the protection circuit 10 are explained.

FIGS. 2 to 4 refer to operation mode plots of the electrical power system 12, in which the AC current 36 at the output 14 of the electrical power system 12 does not exceed the measurement dynamic range $V_{dyn}$ of the current sensor 20.

FIG. 2 shows the AC current 36 flowing via the electrical power system 12. The AC current 36 has a maximum amplitude of 220 A. That maximum amplitude of the AC current 36 corresponds to a value of the electric signal 38 which value is just below the boundary of 2.4 V of the measurement dynamic range $V_{dyn}$ of the current sensor 20. Even though the examples here show the sensor dynamic range expressed in volts, other kind of outputs (e.g., any other physical parameter such as current, impedance, or their combinations) are also possible, which may be used directly or via a conversion to volts.

Hence, FIG. 2 depicts the generated electric signal 38 from the current sensor 20 when viewed in correspondence with the AC current 36. The relation between the AC current 36 and the generated electric signal 38 in this example is proportional within the dynamic range of the current sensor 20.

FIG. 3 shows the electric signal 38 generated by the current sensor 20 in combination with expanded signal 42, generated by the superimposing module 24. A pulsating DC signal generated by the rectifying module 22 is not shown here because in this case the value of the electric signal 38 does not reach limits of the measurement dynamic range. It shall be appreciated that in such cases, the expanded signal 42 and pulsating DC signal 40 will be identical. Further shown is the predetermined value $V_p$ drawn at 2.2 V. As the amplitude of the electric signal 38 (and also of the pulsating DC signal) stays below the predetermined value $V_p$, the expanded signal 42 follows the pulsating DC signal (latter not shown here).

FIG. 4 depicts the expanded signal 42, over a longer time scale. The band limited signal 44 is obtained by the output of expanded signal 42 after having it passed through the first low-pass filter **26*a* with a time constant of t. The threshold voltage $V_{th}$ is set by the first comparator 30*a* of the logic module 28** to $V_{th}$=1.37 V.

As can be observed from FIG. 4, the logic module 28 can be operable to generate a trip signal after about 9.5 ms, when the amplitude of the band limited signal 44 exceeds the threshold voltage $V_{th}$.

FIGS. 5 to 7 show an operation mode of the electrical power system 12, in which the amplitude of the actual flowing AC current 36 exceeds the measurement dynamic range $V_{dyn}$ of the current sensor 20.

FIG. 5 depicts AC electric current 36 flowing via the electrical power system 12. The AC current 36 has an amplitude of 500 A, which is beyond the boundary of the measurement dynamic range of the current sensor 20, which has $V_{dyn}$ corresponding to 240 A amplitude.

Further, FIG. 5 shows the electric signal 38 from the current sensor 20. The relation between the AC current 36 and the generated electric signal 38 is not proportional any more for higher amplitudes, leading to a clipping of the electric signal 38 of the current sensor 20, exceeding the boundary of the measurement dynamic range of 2.4 V.

FIG. 6 shows pulsating DC signal 40 generated from the electric signal 38. FIG. 6 also shows the expanded signal 42, obtained by processing the pulsating DC signal 40 via the superimposing module 24. In order to generate the expanded signal 42, the pulsating DC signal 40 is replaced by the preselected value $V_s$ for the duration the pulsating DC signal 40 is at or above the predetermined value $V_p$. Otherwise, the expanded signal 42 is equivalent to the pulsating DC signal 40.

As can be seen in this example, magnitude of the preselected value $V_s$ is higher than magnitude of the predetermined value $V_p$; or simply, the preselected value $V_s$ is higher than the predetermined value $V_p$. The predetermined value $V_p$ in this case is set to 2.2 V, which is slightly lower than the boundary value of the measurement dynamic range $V_{dyn}$ of 2.4 V. The preselected value $V_s$ is set to 15 V in this example.

FIG. 7 depicts expanded signal 42, now on a longer time scale. The band limited signal 44 is also shown. The band limited signal 44 generated by the first low-pass filter **26*a* with τ=31.2 ms is rising more rapidly as compared to that in FIG. 4 in a within range operation mode. The threshold voltage is set by the first comparator 30*a* of the logic module 28** to $V_{th}$=1.37 V.

As can be seen from FIG. 7, the logic module 28 can be operable to generate a trip signal when the band limited signal 44 exceeds the threshold voltage $V_{th}$, which in this case occurs at about 4 ms.

FIG. 8 is a diagram showing with curves 46 and 48 the specified characteristics of a circuit breaker. Current is plotted on the y-axis and time is plotted on the x-axis. For any values which lie below the values of the bottom curve 46 (on the shown plot, any coordinates which lie between the axes and the curve 46), no tripping of a circuit breaker should occur, whereas for values which are above the top curve 48 (on the shown plot, any coordinates which lie separated by the curve 48 from the axes), tripping must occur. Hence, curve 46 may demarcate a safe region within which the electrical power system 12 can operate without a need to trip the system. Similarly, curve 48 may demarcate a no-go region to be able to prevent damage to the electrical power system 12 and/or any associated electrical load and/or supplier. The region between the two curves 46 and 48 may be a hysteresis region where a trip may be tolerable, but not essential. As it may be appreciated, the upper curve 48 has a more critical function as compared to the lower curve 46. The upper curve 48 is more safety critical, the lower curve 46 is more operational range related. It may be desirable to implement the upper curve 48 characteristics via a protection element (e.g., a thermal fuse or their likes), which provide a more of a last-line-of-defense type protection. Such elements may sometimes be more difficult to replace if they are inbuilt or if the user needs to purchase them or to keep them in inventory. Accordingly, circuit breakers might be more appropriate for temporary trips which can be reset more easily by the user. The proposed protection circuit 10 can thus be implemented to mimic desired characteristics which can provide a first- or even a second level-of-defense (e.g., if the first level is a conventional circuit breaker) prior to the final protection element based on the curve 48 is triggered. The present teachings can thus allow better safety and reliability, not only from safety standpoint, but also by potentially enhancing availability for the end-user by preventing situations which lead to the final protection element from being triggered.

Example characteristics of the protection circuit 10 is plotted with curve 50. The curve 50 has a steep slope for small times and high currents, which is mainly influenced by the predetermined value $V_p$.

The curve 50 shows several sections 52 (52*a* to 52*d*), wherein only four sections are highlighted here. The curve in each section is shaped by a combination of a low-pass filter 26*a*-26*j* with time constant t and a corresponding comparator 30*a*-30*j* with predetermined threshold $V_{th}$.

For multi-mode operation, (e.g., operation at different voltages) the protection circuit may comprise means to automatically adapt the characteristics 50 so as to provide a reliable protection in either mode. The means for adapting the characteristics may include: one or more look up tables, pre-stored values which are selected based on the specific mode, logic unit with weights specifying the threshold values for the comparators, their likes, or their combinations.

From yet another perspective, there can also be provided software product (e.g., embodied on a non-transitory computer storage medium) comprising instructions, which when executed by a suitable computer processor, or a system comprising suitable means, causes the computer processor or system to perform herein described methods (e.g., perform method steps of herein described methods).

FIG. 9 shows a flowchart for a method for overcurrent protection for an electrical power system 12.

In step S1 the method starts and the electrical power system 12 is switched on.

In step S2 an AC current 36 flowing via the electrical power system 12 is measured with the current sensor 20 and an electric signal 38 in response is generated, wherein the current sensor 20 has a measurement dynamic range.

Next, in step S3, via a rectifying module 22, a pulsating DC signal 40 in response to the electric signal 38 is generated.

In step S4 it is checked whether the pulsating DC signal 40 is below the predetermined value (e.g., $V_p$).

If in step S4 it is determined that the pulsating DC signal 40 is below the predetermined value (e.g., $V_p$) (y=yes), in step S5 an expanded signal 42 is generated via the superimposing module 24. The generated expanded signal 42 in S5 is equal to or tracking the pulsating DC signal 40.

If in step S4 it is determined that the pulsating DC signal 40 is at or above the predetermined value (e.g., $V_p$) (n=no), in step S6, an expanded signal 42 is generated via the superimposing module 24. The generated expanded signal 42 in S6 has a preselected value $V_s$. Thus, for times when the pulsating DC signal 40 is below the predetermined value, an output of S5 may be provided at step S7; while for times when the pulsating DC signal 40 is at or above the predetermined value, an output of S6 may be provided at step S7.

In step S7 a band-limited signal 44 is generated via the at least one low-pass filter 26*a* to shape the expanded signal 42. E.g., the expanded signal 42 provided at S7 for shaping may either be the output of S5, or it may be the output of S6.

In step S8 it is checked via the logic module 32, whether the band-limited signal 44 violates the predetermined threshold (e.g., $V_{th}$).

If in step S8 it is determined that the band-limited signal 44 violates the predetermined threshold (e.g., $V_{th}$) (y=yes), then in step S9 a trip signal is generated via the logic module 28. The trip signal may be used for bringing the electrical power system 12 in a safe state e.g., by cutting off the flow of the AC current 36.

If in step S8 it is determined that the band-limited signal 44 does not violate the predetermined threshold (e.g., $V_{th}$) (n=no), the method may revert to step S2, thereby continuing to monitor the electrical power system 12.

REFERENCE LIST

10 protection circuit
12 electrical power system
14 electrical output
16 conductor
18 conductor
20 current sensor
22 rectifying module
24 superimposing module
26*a-j* low-pass filter
28 logic module
30*a-j* comparator
32 logical OR operator
34 switch
36 AC current
38 electric signal
40 pulsating DC signal
42 expanded signal
44 band limited signal
46 lower limit
48 upper limit
50 current time characteristics of protection circuit
52*a*-52*d* section Although embodiments or aspects have been described in detail for the purpose of illustration, it is to be understood that such detail is solely for that purpose and that the disclosure is not limited to the disclosed embodiments or aspects, but, on the contrary, is intended to cover modifications and equivalent arrangements that are within the spirit and scope of the appended claims. For example, it is to be understood that the present disclosure contemplates that, to the extent possible, one or more features of any embodiment or aspect can be combined with one or more features of any other embodiment or aspect. Aspects which might have been discussed in this disclosure with reference to product category are also combinable with method category and vice-versa.

For purposes of the description, the terms "end," "upper," "lower," "right," "left," "vertical," "horizontal," "top," "bottom," "lateral," "longitudinal," and derivatives thereof shall relate to the embodiments as they are oriented in the drawing figures. However, it is to be understood that the present disclosure may assume various alternative variations and step sequences, except where expressly specified to the contrary. The terms "first," "second," or "third" and their likes have been used to establish a reference to the corresponding feature. For the purposes of scope of the present teachings, saying "first" or "second" does not mean that a particular feature must be attached with a particular sequence or order to be valid. It is also to be understood that the specific devices and processes illustrated in the attached drawings, and described in the following specification, are simply examples and non-limiting embodiments or aspects of the disclosed subject matter. Hence, specific dimensions and other physical characteristics related to the embodiments or aspects disclosed herein are not to be considered as limiting.

No aspect, component, element, structure, act, step, function, instruction, and/or the like used herein should be construed as critical or essential unless explicitly described as such. Also, as used herein, the articles “a” and “an” are intended to include one or more items and may be used interchangeably with “one or more” and “at least one.” Furthermore, as used herein, the term “set” is intended to include one or more items (e.g., related items, unrelated items, a combination of related and unrelated items, and/or the like) and may be used interchangeably with “one or more” or “at least one.” Where only one item is intended, the term “one” or similar language is used. Also, as used herein, the terms “has,” “have,” “having,” or the like are intended to be open-ended terms. Further, the phrase “based on” is intended to mean “based at least partially on” unless explicitly stated otherwise. In addition, reference to an action being “based on” a condition may refer to the action being “in response to” the condition. For example, the phrases “based on” and “in response to” may, in some non-limiting embodiments or aspects, refer to a condition for automatically triggering an action (e.g., a specific operation of an electronic device, such as a computing device, a processor, and/or the like).

The invention claimed is:

1. A protection circuit for protecting an electrical power system, wherein the protection circuit comprises:
- a current sensor operable to generate an electric signal by measuring an AC current flowing via the electrical power system; wherein the current sensor has a measurement dynamic range;
- a rectifying module operable to generate a pulsating DC signal in response to the electric signal;
- a superimposing module operable to generate an expanded signal; wherein the expanded signal is equal to or tracking the pulsating DC signal for the duration the pulsating DC signal is below a predetermined value, and wherein the expanded signal has a preselected value for the duration the pulsating DC signal is at or above the predetermined value;
- a low-pass filter configured to shape the expanded signal to generate a band-limited signal; and
- a logic module configured to generate a trip signal when the band-limited signal violates a predetermined threshold; wherein the trip signal is usable for cutting off the flow of the AC current, thereby bringing the electrical power system in a safe state.

2. The protection circuit according to claim 1, wherein a magnitude of the preselected value is higher than a magnitude of the predetermined value.

3. The protection circuit according to claim 1, wherein the predetermined value of the superimposing module, the preselected value of the superimposing module, a time constant of the low-pass filter and/or the predetermined threshold is selectable in dependence on an operating mode of the electrical power system.

4. The protection circuit according to claim 1, wherein the protection circuit comprises at least two low-pass filters arranged in cascade.

5. The protection circuit according to claim 1, wherein the protection circuit comprises multiple low pass filters.

6. The protection circuit according to claim 4, wherein each low pass filter has a different time constant, and the time constant of a further low pass filter is larger than the time constant of the previous low pass filter.

7. The protection circuit according to claim 1, wherein the logic module comprises at least one comparator.

8. The protection circuit according to claim 1, wherein the logic module comprises at least two comparators, wherein a predetermined threshold of a second comparator is lower than a predetermined threshold of a first comparator.

9. The protection circuit according to claim 8, wherein the at least two comparators have their outputs linked by a logical OR operation.

10. The protection circuit according to claim 1, wherein a limit detector module is configured to detect when the pulsating DC signal is at or above the predetermined value.

11. The protection circuit according to claim 1, wherein the predetermined value is lower than a limit value of the measurement dynamic range.

12. The protection circuit according to claim 1, wherein the preselected value is larger than a limit value of the measurement dynamic range.

13. The protection circuit according to claim 1, wherein the rectifying module, the superimposing module, the low-pass filter and/or the logic module are at least partially implemented in a digital domain.

14. A method for overcurrent protection for an electrical power system, the method comprising:
- measuring an AC current flowing via the electrical power system with a current sensor and generating an electric signal in response, wherein the current sensor has a measurement dynamic range;
- generating, via a rectifying module, a pulsating DC signal in response to the electric signal;
- generating, via a superimposing module, an expanded signal, wherein the expanded signal is equal to or tracking the pulsating DC signal for the duration the pulsating DC signal is below a predetermined value, and wherein the expanded signal has a preselected value for the duration the pulsating DC signal is at or above the predetermined value;
- generating, via a low-pass filter, a band-limited signal to shape the expanded signal; and
- generating, via a logic module, a trip signal when the band-limited signal violates a predetermined threshold, wherein the trip signal is used for cutting off the flow of the AC current, thereby bringing the electrical power system in a safe state.

15. The method of claim 14, wherein a magnitude of the preselected value is higher than a magnitude of the predetermined value.

16. The method of claim 14, wherein the predetermined value of the superimposing module, the preselected value of the superimposing module, a time constant of the low-pass filter and/or the predetermined threshold is selectable in dependence on an operating mode of the electrical power system.

17. The method of claim 14, wherein the predetermined value is lower than a limit value of the measurement dynamic range.

18. The method of claim 14, wherein the preselected value is larger than a limit value of the measurement dynamic range.

19. The method of claim 14, wherein the rectifying module, the superimposing module, the low-pass filter and/or the logic module are at least partially implemented in a digital domain.

20. A non-transitory computer-readable storage medium comprising programming instructions stored thereon, wherein, when executed by a processor, the programming instructions cause the processor to perform the steps of:

measuring an AC current flowing via the electrical power system with a current sensor and generating an electric signal in response, wherein the current sensor has a measurement dynamic range;

generating, via a rectifying module, a pulsating DC signal in response to the electric signal;

generating, via a superimposing module, an expanded signal, wherein the expanded signal is equal to or tracking the pulsating DC signal for the duration the pulsating DC signal is below a predetermined value, and wherein the expanded signal has a preselected value for the duration the pulsating DC signal is at or above the predetermined value;

generating, via a low-pass filter, a band-limited signal to shape the expanded signal; and generating, via a logic module, a trip signal when the band-limited signal violates a predetermined threshold, wherein the trip signal is used for cutting off the flow of the AC current, thereby bringing the electrical power system in a safe state.

* * * * *